United States Patent [19]

Sasanuma et al.

[11] Patent Number: 4,480,010
[45] Date of Patent: Oct. 30, 1984

[54] METHOD AND COATING MATERIALS BY ION PLATING

[75] Inventors: Yasutomo Sasanuma, Kawagoe; Masao Koshi, Sayama; Teruaki Takahashi, Iruma; Shotaro Shimizu, Kunitachi; Mitsugu Enomoto, Higashikurume; Youji Yoshikawa, Sayama, all of Japan

[73] Assignee: Citizen Watch Co., Ltd., Tokyo, Japan

[21] Appl. No.: 497,881

[22] Filed: May 25, 1983

[30] Foreign Application Priority Data

Jun. 18, 1982 [JP] Japan .............................. 57-105155

[51] Int. Cl.³ ............................................. B32B 15/04
[52] U.S. Cl. ....................................... 428/457; 427/38; 428/688; 428/689; 428/698
[58] Field of Search .................. 427/38; 428/457, 688, 428/689, 698

[56] References Cited

U.S. PATENT DOCUMENTS 4,152,478  5/1979  Takagi .................................. 428/221

Primary Examiner—Bernard D. Pianalto
Attorney, Agent, or Firm—Koda and Androlia

[57] ABSTRACT

By use of an ion plating apparatus having an ionizing means which can be operated independently of the electric potential of a substrate, at the initial and final stages of the process of ion plating, a negative potential relative to that of a vapor source is applied to the substrate in order to facilitate the bombardment effect and at the intermediate stage of the process, the potential of the substrate is left floating while the ionization means is being driven in order to control the bombardment effect. In a preferred example, the apparatus has thermoelectron emitting filaments located near the substrate and a pair of anodes located on the side of the vapor source with respect to the substrate and on the opposite side of the substrate. This process permits producing relatively thick and adherent coatings.

11 Claims, 2 Drawing Figures

METHOD AND COATING MATERIALS BY ION PLATING

BACKGROUND OF THE INVENTION

1. Field of the Invention

This invention relates to a method and apparatus for coating materials by ion plating.

2. Prior Art

The following process has become known as ion plating: a vapor of an evaporation material from a vapor source and a gas introduced from a gas inlet are ionized by an ionizing means, and a film of a metal, alloy, compound, etc. is deposited on a substrate surface which is at a negative potential relative to that of the vapor source. Especially, the process where the ionized vapor of an evaporation material reacts with an ionized gas atmosphere to form a compound is called reactive ion plating.

The technology for producing a gold-colored titanium nitride (TiN) layer onto the surface of a decorative part by this process has been disclosed, for example, in U.S. Pat. No. 4,226,082. In the process of ion plating, a negatively biased substrate surface is always subjected to positive ion bombardment and simultaneously deposited with the coating material. Accordingly, poorly adhesive particles are bombarded and evaporated again and only highly adhesive particles are deposited. As a result, a coating having excellent adherence and close packing can be produced, but the deposition rate is slow, when compared with usual evaporations.

The close-packed coating hardly relaxes a stress and increases the residual stress as the coating grows. This stress will cause destructive cracking. It is, therefore, difficult to grow a film to an appropriate thickness.

It has been proposed, therefore, to use ion plating at the initial stage of a coating process which requires adhesion and then to exchange it to a usual evaporation process so as to grow the coating (see Japanese Published Unexamined Patent Application No. 50-133936).

However, usual evaporations have no means to ionize the vapor of an evaporation material. Therefore, reactivity is not full enough to produce a coating of intended quality, especially in the formation of compound films. Furthermore, usual evaporations are performed under relatively high vacuum conditions, thus causing less vapor to disperse roundabout. It is difficult to coat a film with a uniform thickness onto the sides and back of a substrate of intricate shape.

SUMMARY OF THE INVENTION

The purpose of the invention is to eliminate the above-mentioned drawbacks of conventional technologies. For this purpose, the present invention uses an ion plating apparatus having an ionizing means which can be operated independently of the electric potential of a substrate, in which at the initial and final stages of the process of ion plating, a negative potential relative to that of a vapor source is applied to the substrate in order to facilitate the bombardment effect, and at the intermediate stage of the process, while the ionizing means is being driven, the substrate is left floating in order to control the bombardment effect.

DETAILED DESCRIPTION OF THE INVENTION

Figure 1:
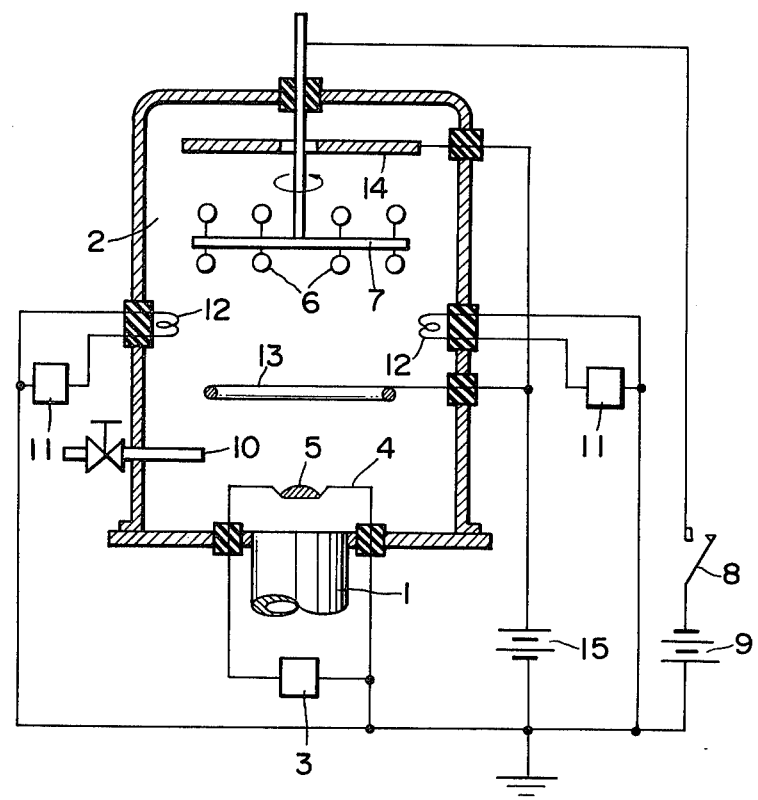
FIG. 1 is a schematic sectional view illustrating the structure of an ion plating apparatus used in the coating method according to the invention.

Now, the invention will be explained through the use of the following examples with reference to the accompanying drawing:

Referring now to FIG. 1, there is schematically shown the structure of an ion plating apparatus used in the coating method according to the invention:

Within a vacuum chamber 2 evacuated by an evacuation system 1 is placed a vapor source 4 which is driven by a power supply 3 for driving it and is kept at ground potential. From this vapor source 4, an evaporation material 5 is evaporated. Above the vapor source 4 is positioned a rotary substrate holder 7 which has many substrates 6 and is designed so that a negative potential to ground is applied thereto through a power supply switch 8 and a cathode power supply 9. As the vapor source 4, besides the resistance heating vapor source shown in the figure, a filament type or hollow cathode type electron beam melting vapor source is used, depending upon the intended purpose.

In the close vicinity of the vapor source 4, a gas inlet 10 is opened. A pair of anodes 13 and 14 to which a positive potential is applied by an anode power supply 15 are located on the side of the vapor source 4 with respect to the substrates 6 and on the opposite side of the substrates 6. The lower anode 13 is of a ring shape and the upper anode 14 is of a disc shape. Between the anodes 13 and 14 are thermoelectron emitting filaments 12 which are driven by the respective filament heating power supplies 11 and kept at ground potential. In this apparatus, the thermoelectron emitting filaments 12 and the pair of anodes 13 and 14 form an ionizing means.

EXAMPLE 1

Coating of titanium nitride (TiN) using the apparatus shown in FIG. 1 will be described by the following example of the invention:

Titanium was placed as the evaporation material 5 on the vapor source 4 and watch cases made of stainless steel were set as the substrates 6 on the substrate holder 7.

Within the vacuum chamber 2 evacuated to approximately $10^{-5}$ torr through the evacuation system 1, an argon gas was introduced from the gas inlet 10, so that the gas pressure was kept at approximately $10^{-3}$ torr.

Under that condition, when the thermoelectron emitting filaments 12 and the pair of anodes 13 and 14 were driven, electrons were emitted from the filaments 12 and accelerated by the anodes 13 and 14. The electron stream allowed the argon gas to be discharged and ionized, thus filling the vacuum chamber 2 with the discharge gas plasma.

Then, by closing the power supply switch 8 and applying a negative potential to the substrates 6, the substrate surfaces were bombarded and cleaned with positively charged argon ions.

Next, when the introduced gas was switched to an argon-nitrogen mixed gas and the vapor source 4 was driven to evaporate titanium as the evaporation material, the titanium vapor and nitrogen gas were ionized into an active state and formed a titanium nitride compound, which was, in turn, deposited on the substrate surface.

At that stage, since the negative potential relative to that of the vapor source 4 was applied to the substrates 6, the substrate surfaces were deposited with the titanium nitride compound, while being bombarded with the introduced gas ions and the titanium ions. Therefore, a film having excellent adherence and close packing was formed at a deposition rate of about $0.01\mu$/min.

After that operation was continued for 10 minutes to form an about $1\mu$ thick film, the power supply switch 8 was opened to make the potential of the substrate 6 floating.

At that time, the ionizing means composed of the thermoelectron emitting filaments 12 and the anodes 13 and 14 was operated independently of the potential of the substrates 6. Therefore, there was little variation in ionization efficiency, and in the region between the anodes 13 and 14, that is, near the substrate holder 7, a uniform density plasma was maintained. On the other hand, as the potential of the substrates 6 in the floating state was substantially the same as the potential of plasma around the substrates 6, there was little effect of ion bombardment on the substrates 6. Therefore, at that stage, a sufficiently activated and reactive titanium nitride film was formed effectively at a deposition rate of about $0.05\mu$/min.

After growing the film about $0.05\mu$ thick at the intermediate stage, the substrates 6 were set at negative potential again and a close-packed film was formed to a thickness of about $0.1\mu$. At that final stage, the negative potential applied to the substrates 6 was adjusted to control theluster and hue of the deposit.

Figure 2:
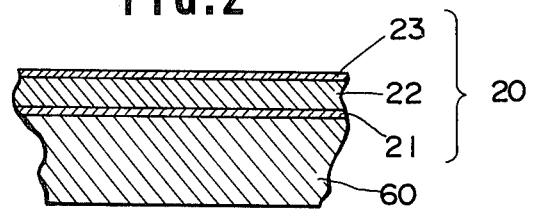
FIG. 2 is a sectional view illustrating the structure of a film produced by the coating method according to the invention.

FIG. 2 is a schematic sectional view illustrating the structure of the titanium nitride film produced in the above-mentioned example. A titanium nitride film 20 produced on the surface of a substrate 60 comprises three layers, in which a base coat layer 21 and a topcoat layer 23 are relatively close-packed films formed with the substrate 60 kept at the negative potential and they are about $0.1\mu$ in thickness, respectively.

An intermediate layer 22 is made of a relatively less close-packed film formed with the substrate 60 kept at the floating potential and it is about $0.5\mu$ in thickness. In the titanium nitride film thus formed, the base coat layer 21 assures sufficient adhesion at its interface with the substrate 60, the less close-packed intermediate layer 22 relaxes the stress and gives the required thickness; and the topcoat layer 23 assures the surface hardness and wear resistance and allows the luster and hue of the coating to be controlled. Such coating is most useful for decorative parts and tools requiring wear resistance.

When only the close-packed titanium nitride film 21 is formed to a thickness exceeding about $0.2\mu$, cracking will often occur. In this example, however, a total of $0.7\mu$ thick film of greater wear resistance has been obtained.

EXAMPLE 2

Cutting tools made of tungsten carbide (WC) were set as the substrates 6 on the substrate holder 7. An argon-nitrogen-acetylene mixed gas was introduced, and the process of ion plating comprising three steps was performed as in example 1. As a result, a total of $1.2\mu$ thick titanium carbonitride [Ti (C, N)] coating has successfully been produced, greatly increasing the tool life. With this example, the intermediate layer is $0.9\mu$ in thickness.

EXAMPLE 3

The similar process as in example 2 was repeated twice, thus producing a total of $2\mu$ thick titanium carbonitride film onto cutting tool surfaces. The coating comprises five layers. The close-packed topcoat and base coat layers are $0.1\mu$ and $0.2\mu$ in thickness, respectively, and in a $1.7\mu$ thick intermediate layer is interposed a close-packed film having a thickness of $0.1\mu$. It has been recognized that the life of the cutting tools thus coated with a thick hard film is about ten times longer than before.

EXAMPLE 4

Steel rotor shafts for small motors were set as the substrates 6 on the substrate holder 7, and chromium was used as the evaporation material 5. An argon gas was introduced, and the process of ion plating comprising three steps was performed as in example 1. When chromium is deposited by the ion plating process to a film exceeding $0.1\mu$ in thickness, cracking will often occur. However, the method of the invention has successfully produced a total of $0.5\mu$ thick chromium film without cracking. In this case, the close-packed base coat layer and top coat layer are $0.05\mu$ in thickness, respectively, and the intermediate layer is $0.4\mu$ in thickness. The rotor shafts thus ion plated with chromium exhibit excellent wear resistance.

As will appear from the above-mentioned examples, the coating method according to the invention permits a hard film which is apt to accumulate a residual stress to be formed uniformly and relatively thickly over the entire surface.

The coating method of the invention is most useful for producing films onto parts of intricate shape such as decorative parts including watch cases and frames of spectacles, cutting tools, sliding surfaces of mechanical parts, and the like.

In the coating method according to the invention, it is necessary to continue operating the ionizing means even when the potential of substrates 6 is left floating. For this purpose, the ionizing means is required to operate independently of the potential of the substrate. As such ionizing means, besides a combination of thermoelectron emitting filaments and anodes mentioned above, an RF excitation type has been known, and either means can be used in the coating method of the invention. The following types of apparatus are known as the former examples: a type in which anodes are located above the vapor source. (Japanese Unexamined Patent Application No. 52-24990) and a type in which anodes are located at the rear of the substrate (Japanese Unexamined Patent Application No. 55-48107).

The apparatus of the invention illustrated in FIG. 1 has been improved on the above apparatus. As already stated above, the apparatus of the invention has an ionizing means composed of a pair of anodes 13 and 14 on the opposite sides with respect to the substrates 6, and a plurality of thermoelectron emitting filaments 12 therebetween.

With the above structure, the plasma near the substrates 6 becomes uniform in density, and when the substrates 6 are left floating, the potential of the substrates 6 becomes the same as that of the plasma. Therefore, while the high ionization effect is maintained, the bombardment effect on the substrates 6 can efficiently be controlled.

The apparatus having such functions according to the invention is useful especially for the purpose of coating uniform films on many substrates or a substrate of intricate shape. However, the coating method of the invention is not limited to the one using the apparatus shown in FIG. 1.

What is claimed is:

1. A method for coating materials by ion plating comprising the steps of:
providing an ion plating apparatus comprising:
- a vapor source at ground potential;
- a substrate holder located above said vapor source;
- a pair of anodes located on the side of said vapor source with respect to said substrate holder and the opposite side of said substrate holder;
- one or more thermoelectron emitting filaments located between said anodes;
- a vacuum chamber for accomodating said elements, said vacuum chamber having a gas inlet and an evacuation system;
- means for applying a negative potential relative to that of said vapor source to a substrate supported by said substrate holder; and
- means for removing said negative potential to leave the potential of said substrate floating;

at an initial stage, ionizing a gas introduced from said gas inlet and a vapor of an evaporation material from said vapor source, and ion plating a surface of said substrate with a film of said evaporation material or a compound of said evaporation material and said introduced gas, said substrate being cathodically biased relative to said vapor source;

at an intermediate stage, while driving said ionizing means, continuing ion plating with the potential of said substrate left floating; and at a final stage, while driving said ionizing means, continuing ion plating with the potential of said substrate again made negative relative to that of said vapor source.

2. A method for coating materials by ion plating according to claim 1 wherein said film comprises a hard material apt to accumulate a residual stress.

3. A method for coating materials by ion plating according to claim 2 wherein said hard material is titanium nitride.

4. A method for coating materials by ion plating according to claim 2 wherein said hard material is titanium carbonitride.

5. A method for coating materials by ion plating according to claim 2 wherein said hard material is chromium.

6. A method for coating materials by ion plating comprising the steps of:
providing an ion plating appartus an ionizing means operated independently of a potential of comprising:
- a vapor source at ground potential;
- a substrate holder located above said vapor source;
- a pair of anodes located on the side of said vapor source with respect to said substrate holder and the opposite side of said substrate holder;
- one or more thermoelectron emitting filaments located between said anodes;
- a vacuum chamber for accommodating said elements, said vacuum chamber having a gas inlet and an evacuation system;
- means for applying a negative potential relative to that of said vapor source to a substrate supported by said substrate holder; and
- means for removing said negative potential to leave the potential of said substrate floating;

at an initial stage, ionizing a gas introduced from said gas inlet and a vapor of an evaporation material from said vapor source, and ion plating a surface of said substrate with a film of said evaporation material or a compound of said evaporation material and said introduced gas, said substrate being cathodically biased relative to that of said vapor source;

at an intermediate stage, while driving said ionizing means, repeating alternately the ion plating step with the potential of said substrate left floating and the ion plating step with the potential of said substrate made negative relative to that of said vapor source so as to stack films; and at a final stage, while driving said ionizing means, continuing ion plating with the potential of said substrate again made negative relative to that of said vapor source.

7. A method for coating materials by ion plating according to claim 6 wherein said film comprises a hard material apt to accumulate a residual stress.

8. A method for coating materials by ion plating according to claim 7 wherein said hard material is titanium nitride.

9. A method for coating materials by ion plating according to claim 7 wherein said hard material is titanium carbonitride.

10. A method for coating materials by ion plating according to claim 7 wherein said hard material is chromium.

11. A coated substrate made by the method of claim 1.

* * * * *